(12) United States Patent
Jarvinen et al.

(10) Patent No.: US 6,170,073 B1
(45) Date of Patent: Jan. 2, 2001

(54) METHOD AND APPARATUS FOR ERROR DETECTION IN DIGITAL COMMUNICATIONS

(75) Inventors: Kari Jarvinen, Tampere; Janne Vainio, Saaksjarvi; Petri Haavisto; Tero Honkanen, both of Tampere, all of (FI)

(73) Assignee: Nokia Mobile Phones (UK) Limited, Salo (FI)

(*) Notice: Under 35 U.S.C. 154(b), the term of this patent shall be extended for 0 days.

(21) Appl. No.: 08/821,537

(22) Filed: Mar. 21, 1997

Related U.S. Application Data

(60) Provisional application No. 60/014,338, filed on Mar. 29, 1996.

(51) Int. Cl.[7] .................................................. H03M 13/00
(52) U.S. Cl. .......................... 714/758; 714/755; 714/757; 714/752
(58) Field of Search ............................... 371/5.1, 5.2, 5.5, 371/6.3, 37.7, 41, 31, 37.02; 714/704, 705, 708, 709, 746, 758, 774, 747, 776; 370/333

(56) References Cited

U.S. PATENT DOCUMENTS

| | | | |
|---|---|---|---|
| 4,020,461 | 4/1977 | Adams et al. ...................... 340/146.1 |
| 4,680,763 | 7/1987 | Suma et al. ............................ 371/37 |
| 5,073,940 | * 12/1991 | Zinser et al. ........................... 381/47 |
| 5,097,507 | 3/1992 | Zinser et al. ........................... 381/31 |
| 5,247,579 | * 9/1993 | Hardwick et al. ....................... 381/40 |
| 5,255,343 | * 10/1993 | Su ....................................... 395/2.51 |
| 5,349,589 | 9/1994 | Chennakeshu et al. ............... 371/43 |
| 5,432,778 | * 7/1995 | Minde et al. ........................ 370/95.3 |
| 5,517,511 | * 5/1996 | Hardwick et al. ................... 371/37.4 |
| 5,557,639 | 9/1996 | Heikkila et al. ...................... 375/224 |
| 5,596,677 | 1/1997 | Jarvinen et al. .................... 395/2.29 |
| 5,666,370 | * 9/1997 | Ganesan et al. .................. 371/37.01 |
| 5,761,223 | * 6/1998 | Ando et al. ............................ 371/41 |

FOREIGN PATENT DOCUMENTS

| | | |
|---|---|---|
| 2 238 933 | 6/1991 | (GB) . |
| 2 240 013 | 7/1991 | (GB) . |
| 2 291 570 | 1/1996 | (GB) . |
| WO 95/08152 | 3/1995 | (WO) . |

\* cited by examiner

Primary Examiner—Emmanuel L. Moise
Assistant Examiner—Samuel Lin
(74) Attorney, Agent, or Firm—Perman & Green, LLP

(57) ABSTRACT

An encoder encodes digital signals representative of data by classifying the digital signals into first and second classes indicative of their influence on data quality and subjects them to error detection encoding capable of generating at least two error detection codes which respectively correspond to the first and second classes. A decoder receives the encoded digital signals classified into first and second digital signal classes, decodes the error detection codes, and generates error signals, corresponding to the respective digital signal classes, from which the quality of the received digital signals is estimated and the utility of the received digital signals is determined.

51 Claims, 10 Drawing Sheets

METHOD AND APPARATUS FOR ERROR DETECTION IN DIGITAL COMMUNICATIONS

The present application is related to Provisional patent application Ser. No. 60/014,338 of Kari Jarvinnen et al., filed Mar. 29,1996 entitled "Method And Apparatus For Digital Communication", and based on which priority is here with claimed under 35 U.S.C. 119 (e) and the disclosure of which is incorporated herein by reference in its entirety.

BACKGROUND OF THE INVENTION

1. Field of the Invention

The present invention relates to method and apparatus for digital communication. In particular, but not exclusively, to encoding and decoding for digital speech communication.

2. Background Art

In digital communication systems such as speech communication systems, the speech signal is typically processed in frames such that the speech signal is divided into about 20 ms time periods in the transmitter. For each of these periods, i.e., frames, a set of speech parameters is produced which are sent to the receiver. The parameter sets represent the speech signal for each time period. For simplicity, the sets of speech parameters produced for each frame are referred to here as speech parameter frames or speech frames.

In wireless speech communication systems such as in digital cellular systems, there are a number of channel conditions that severely affect the quality of transmission. It is therefore important to carry out error correction coding for the speech parameters. Error correction coding such as convolutional coding provide high error resilience during conditions which result in low numbers of errors but in conditions giving a high number of errors the error correction capability of any error correction coding will eventually be exceeded. Under conditions of severe transmission errors it is therefore important to detect the errors that have remained in the received speech parameters and to prevent these badly corrupted speech parameter frames from being used for synthesis of speech in the receiver. The speech parameter frames that are not used for speech synthesis due to their high level of errors are called bad frames. The received speech parameter frames that are used for speech synthesis are called good frames. If bad frames were used for synthesizing the speech signal in the receiver, highly annoying degradation's such as clicks and beeps would be produced in the synthesized speech.

In the receiver speech frames which will produce no effect or have a low effect on the speech quality must be substituted for the bad frames. The parameters for the substitute frames are produced by bad frame substitution techniques in which a repeated or extrapolated version of one or more of the previously received good speech frames is generated.

In prior-art coding systems such as the full rate (FR) and half rate (HR) coders of the Global System for Mobiles (GSM) system and in the full rate coder of the US Time Division Multiple Access (TDMA) system IS-54, an error detection code is used to detect errors remaining in the received speech parameters. In these systems a cyclic redundancy check (CRC) error detection code is used for some of the most important bits in the speech parameters. In the full rate speech channel of the GSM system, the 50 most important bits of a total of 260 speech parameter bits in each frame are covered by a 3-bit CRC. When a transmission error is detected among the 50 bits covered by the error detection code, the received speech frame is declared to be a bad frame. These frames are not used for speech synthesis but are substituted using well known bad frame substitution techniques.

Bad frame substitution can work well for one, two, even several consecutive lost speech frames. However, since speech sounds typically last only about 200–300 ms at the most, extrapolation of speech parameter frames can only be carried out successfully for about 10 to 15 lost frames. After this period, the decoder output should be silenced. Thus, in typical bad frame substitution such as that utilized for the full rate channel of GSM, given in GSM rec. 06.11, when several consecutive speech frames are substituted by extrapolated parameter values the synthesized speech signal is at the same time gradually attenuated and finally silenced. The attenuation is performed to prevent long artificial sounds being generated in the substitution process.

Current wireless systems do not produce speech which is of the same high quality of that produced in land line systems. A reason for the poor performance of prior art-communication systems in poor transmission conditions is that severe degradations in the synthesized speech occur due to a cumulative process from a multitude of errors in the less significant bits outside the error detection code.

In the current GSM system most of the speech parameter bits are left totally outside error detection. To extend the error detection code to cover the less significant bits also, so that any error in them is detected, would provide safe operation against transmission error but would make bad frame detection too sensitive for small errors. For example, a single bit error in the less important bits would cause the received speech parameter frame to be classified as a bad frame and to be lost. Bad frame substitution and speech muting would then occur too often in poor transmission conditions. There is the likelihood that speech synthesis would be completely cut off except for occasional error-free speech frames being passed to the speech decoder. These would not be able to synthesize any understandable speech but only to generate disturbing sounds.

To improve the quality of speech transmission various methods have been proposed. For example, besides using error detection codes, it is possible to obtain an estimate of the quality of the receiver speech parameter frames on the basis of reliability information available from the radio parts of a receiver. This information can be, e.g., signal to noise ratio measured for the radio channel or soft bit values obtained from the demodulator. Also error correction decoding, such as the Viterbi algorithm, may be used to produce some indication of how well error correction has succeeded. Due to low reliability, this kind of additional soft quality information can only supplement the error detection information obtained using real error detection codes and it is too vague to result in any considerable improvement in bad frame detection.

SUMMARY OF THE INVENTION

In accordance with a first aspect of the invention there is provided an encoder for digital communication, comprising; means for encoding digital signals representative of data, means for classifying the digital signals into first and second classes indicative of their influence on data quality, and means for error detection encoding capable of generating at least two error detection codes, wherein the at least two error detection codes respectively correspond to the first and second classes.

In accordance with a second aspect of the invention there is provided a decoder for digital communication, including:

means for receiving encoded digital signals classified into first and second digital signal classes corresponding to importance of said digital signals, error detection decoding means for generating an error signal corresponding to respective digital signal classes, means for estimating the quality of the received digital signals responsive to the error signals generated by the error detecting means and means for determining the utility of the received digital signals dependent upon a result of the quality estimating means.

In accordance with a third aspect of the invention there is provided a method for digital communication encoding, comprising receiving digital signals representative of data, classifying the digital signals into first and second classes indicative of their influence on data quality, and generating at least two error detection codes respectively corresponding to the first and second classes.

In accordance with a fourth aspect of the invention, there is provided a method for digital communication decoding, comprising: receiving encoded digital signals classified into first and second digital signal classes corresponding to the important of said digital signals, decoding the received encoded digital signals for detecting an error corresponding to respective first and second digital signal classes, and estimating the quality of received digital signals based on a result of decoding the received encoded digital signals.

In a preferred embodiment of the invention, the utility of the received digital signals is determined dependent on a result of estimating their quality in the quality estimating means.

An advantage of the invention is that the importance of a detected error to the quality of the received data can be determined. If the detected error is of low importance then the received data can be regarded as good. This reduces the number of lost signals and reduces the need for bad signal substitution. Additionally, the number of undetected bad signals is reduced and thus signals having the potential to cause degradations in the reconstructed signals are detectable and inhibited from being used for such reconstruction. Furthermore, the level of error in a received signal can be determined, and this can be used to modify a signal containing an error of low importance to take account of the error or to determine whether previously received digital signals having low error could be used to substitute for a received bad signal. Thus, both reconstruction of data and bad signal substitution may be adjusted to reduce the effect of errors in received signals and thereby improve reconstructed signal quality.

Preferably the data is speech and the digital signals are classified according to their importance to speech quality. An advantage of the present invention is that it is particularly well suited for applications involving speech. Since synthesized speech comprises bits having different importance to subjective speech quality they can conveniently be classified into classes according to their importance. Thus, analyzing errors in transmitted speech according to the importance of the digital signals for which an error occurred is particularly useful.

The first and second classes may be mutually exclusive, which provides for accurate detection of in which digital signal class an error occurred. Optionally, the first and second classes may be inclusive, and in a suitable embodiment utilizing inclusive classes the first class generated in a first coding means and the second class generated in a second coding means sequentially operable to the first coding means. This has an advantage that an error may be more likely to be detected since it may occur in both classes.

Advantageously, the first coding means is a speech encoder and the second coding means is a channel encoder. Channel coding may be used to error detection encode the error detection coded signals from the speech encoder, thereby optimizing overall error detection coding. Additionally, error correction encoding may be carried out in the channel encoder.

Suitably, first and second digital signal classes are associated with respective weighting parameters $K_1, K_2$ indicative of the importance of said first and second digital signal classes.

By using the importance weighting, the combined effect of errors in different classes can be taken into account according to their importance to the signal (e.g., speech) quality. The most important classes have higher weighting than the less important ones.

Weighting provides for detection of errors in the least important classes so that they do not unnecessarily result in classifying slightly erroneous signals as bad signals. This reduces the amount of detected bad signals and therefore the need for bad signal substitution.

The using of weighting may also provide information on how erroneous a good signal is and may be utilized to assist in determining what actions to take in the decoder.

Optionally, values of respective weighting parameters $K_1, k_2$, are variable in accordance with the error level for the received digital signals which allows for weighting values to be scaled down in bad transmission conditions to reduce the number of signals classified as bad. Additionally, since a high quality of signal is unlikely to be received during bad transmission conditions, it is prudent to increase the through put of useable signals by lowering the weighting values. Advantageously, the weighting of the least important signals should be reduced the most, since they have the least impact on signal quality.

Typically, the quality estimating means is operable in accordance with the following relationship;

$$B = k_1 QCRC_{Sl1} + k_2 QCRC_{s12} + \ldots + \ldots k_n QCRC_{SlN,}$$

where B is the quality estimating means result, $k_i$ is the weighting parameter for the $i^{th}$ digital signal class and $QCRC_{Sli}$ is a binary value for indicating an occurrence of an error in $i^{th}$ digital signal class, where 1=1, . . . , N. This equation results in a gray scale for the quality of a received signal, instead of the binary good/bad indication hitherto available. This gray scale information can be used to modify signals which have only small errors, to make them useable.

Generally, a signal is considered good if B is less than a pre-determined threshold. Thus, the threshold defines a limit above the errors in the received signal would degrade the decoded the decoded data unacceptably.

In a particularly advantageous embodiment of the invention, digital signals are representative of speech and a classified in accordance with their importance of speech quality, and the digital signals are formatted into speech frames comprising speech parameters.

This makes the invention particularly suitable for applications involving speech. A speech signal is typically slowly varying within a short time frame or segment. Frame based processing takes advantage of the slowly varying nature of speech to give efficient speech coding. Since speech codes are generally frame based, the invention can be easily combined with them if it utilizes frame based signal formats. Advantageously, a speech detector can be combined with the present invention easily and combined with frame formatted signals.

A frame is determined good for B less than the predetermined threshold and bad for B greater than an equal to the predetermined threshold which inhibits bad frames from being used in speech synthesis thereby improving synthesized speech quality.

Knowledge of good frames may be utilized to determine whether a previous good frame is substitutable for a bad frame, and whether the previous good frame is transferable to the speech decoding means. Additionally, digital signals in a frame are attenuable in accordance with the result of the quality estimating means associated with said frame.

Thus, the more errors contained in a frame classified as good, the greater the attentuation to inhibit the effect of those errors in the synthesized speech. This also applies during bad frame substitution.

BRIEF DESCRIPTION OF THE DRAWINGS

Detailed descriptions of embodiments in accordance with the invention will now be described, by way of example only, and with reference to the drawings, in which.

DESCRIPTION OF THE INVENTION

Figure 1:
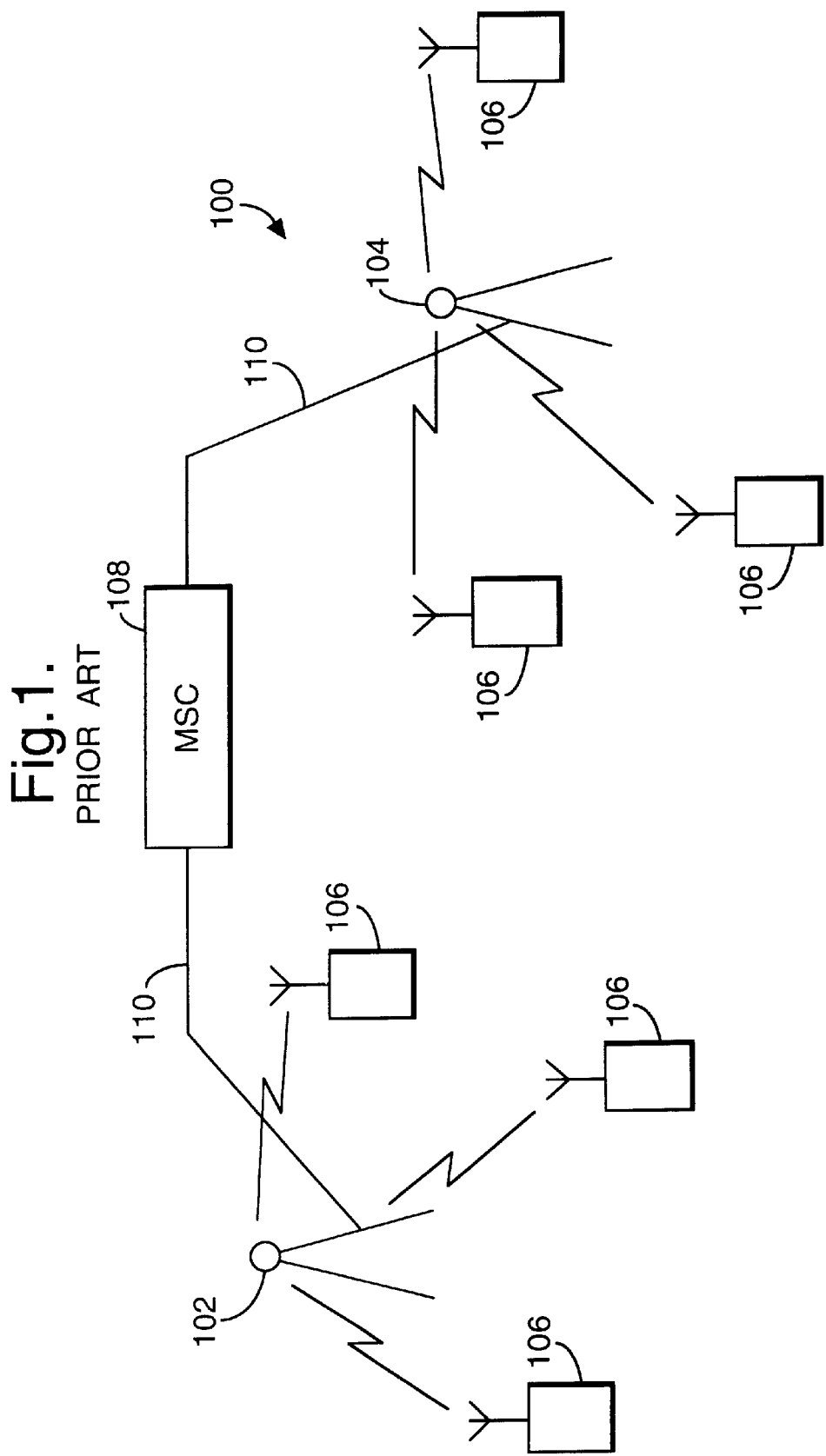
FIG. 1 shows a diagrammatic representation of a radio telephone network.

Referring now to FIG. 1, there is shown a schematic representation of a typical radio telephone network 100, for example a Global System for Mobiles (GSM) network. The network geographical coverage area is divided up into smaller geographical areas known as cells. Each cell has a base station (BS) 102, 104 for communication with mobile terminals 106 located within respective cells. The operation of the radio telephone network 100 is controlled by one or more Mobile Switching Centers (MSC) 108, which amongst other things monitor the location of respective mobile terminals 106 and route calls between mobile terminals 106 and the Public Switched Telephone Network (PSTN). The base stations 102, 104 may be directly connected to the MSC via wire line or radio link 110, or be coupled first to a Base Station Controller (BSC) which controls a number of base stations 102, 104.

Figure 2:
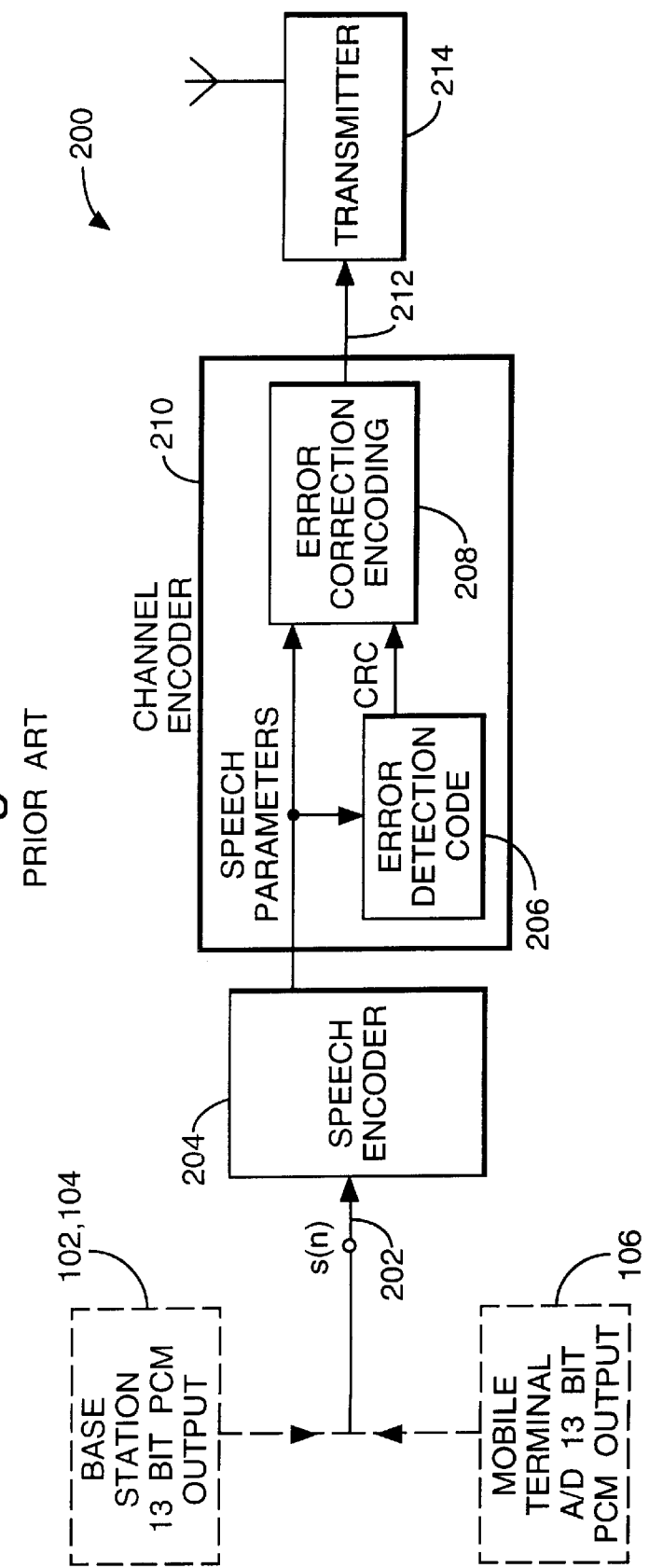
FIG. 2 depicts a block diagram of a known speech and channel encoder.

A known encoder 200 for representing speech signals digitally is shown schematically in FIG. 2. A 13-bit Pulse Code Modulated (PCM) speech signal s(n) 202 is input to a speech encoder 204. The PCM speech signal 202 is provided by a base station 102, 104, which converts land line 8-bit A law signals into 13-bit PCM, or the audio part of a mobile terminal 106 which converts input analogue speech to 13-bit PCM. The respective base station 102, 104 and mobile terminal 106 parts are shown dotted in FIG. 2 to indicate that they are interchangeable and not physically connected as shown.

The speech signal 202 is encoded in speech encoder 204 to produce speech parameters representative of the speech signal 202. The encoding is performed in separate time intervals of typically 20 ms in length, known as frames. In the GSM Full Rate Speech Encoder there are 260 bits/frame, which gives a 13.0 kbit/s data rate. A set of speech parameters is produced every 20 ms. The speech parameters are forwarded to a channel encoder 210 where error detection encoding 206 and error correction encoding 208 is carried out. It should be noted that not all the speech parameters undergo error detection or correction encoding. The encoded speech 212 is forwarded to the transmitter 214 of either base station 102, 104 or mobile terminal 106, depending upon the unit in which the encoder 200 is located.

Figure 3:
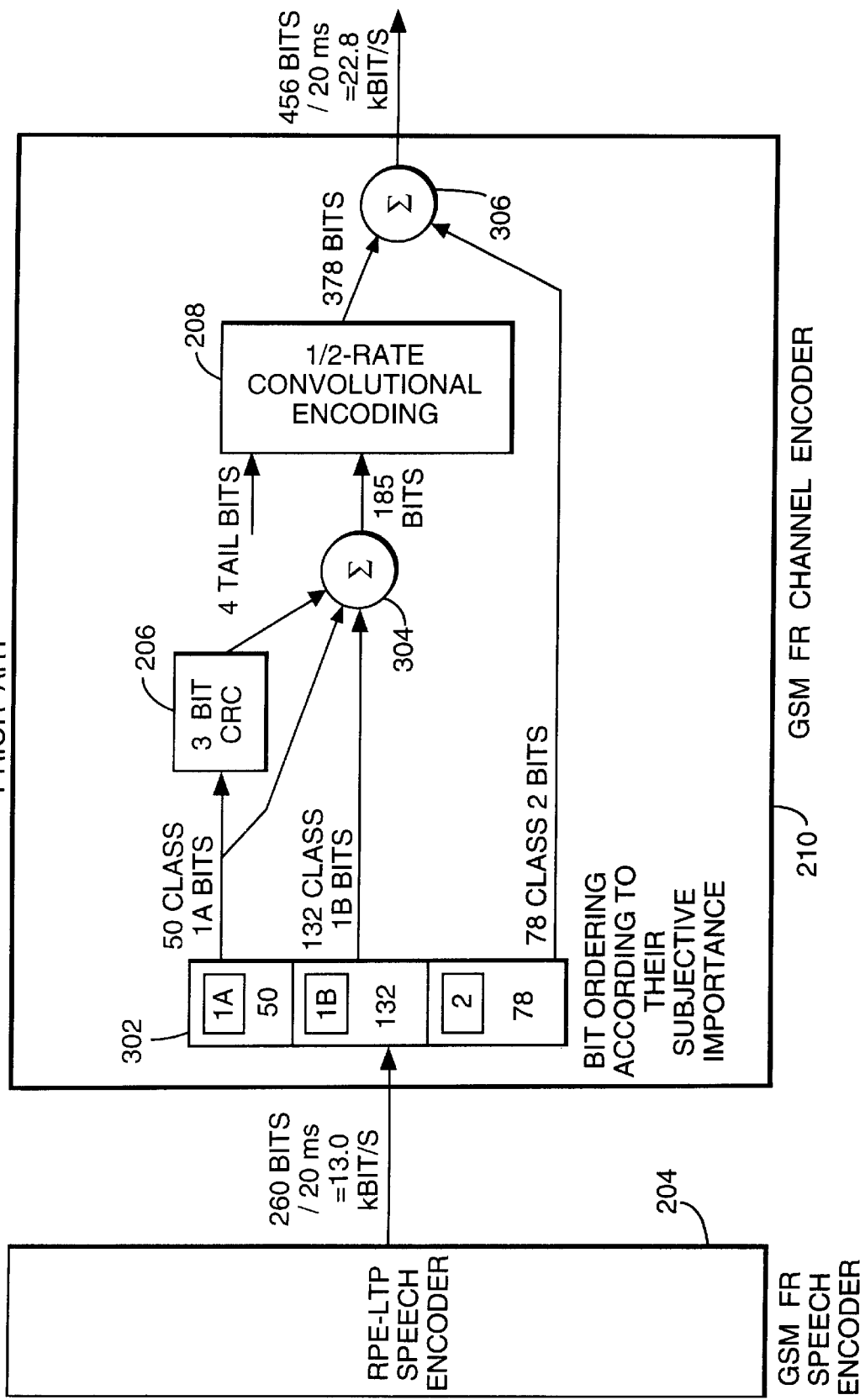
FIG. 3 depicts a more detailed diagram of the known speech and channel encoder of FIG. 2.

A more detailed diagram of channel encoder 210 is shown in FIG. 3. Speech encoder 204, which is this exemplary Figure is a GSM Full Rate speech encoder, is a Regular Pulse Excitation—Long Term Prediction (RPE-LTP) speech encoder, and provides data at a rate of 13.0 kbit/s to channel encoder 210. The RPE-LTP speech encoder is well known in the art and no further discussion of its operation will be given in relation to the present invention. Channel encoder 210 receives the 13.0 kbit/s data in frames of 260 bits/20 ms and re-orders it in block 302 based upon the importance of the bits, to subjective speech quality. The bits are re-ordered a frame at a time. The order of importance is fixed and is typically obtained by subjective listening tests during the development of the particular speech coding algorithm.

The 260 bits in each frame are separated into three classes; Class 1A, Class 1B and Class 2.

The fifty most important bits are placed in Class 1A, the next 132 most important bits are placed in Class 1B, and the remaining 78 bits are placed in Class 2. The ordering of the bits is described in a bit importance map disclosed in GSM recommendation 06.10.

The error detection encoder 206 typically provides cyclic redundancy check (CRC) bits. The CRC bits are usually placed amongst the bits which are later subjected to error correction encoding to facilitate high levels of reliability for the error detection bits. The output of the error detection coder 206 is 3 bits which are forwarded to adder 304. A second input to adder 304 is the original 50 Class 1A bits, and a third input is the 132 Class 1B bits. A total of 185 bits are output from adder 304 and input to error correction encoder 208. The 185 bits are reordered and have four tail bits added to them. The resulting 189 bits then undergo convolutional encoding to produce 378 bits. These 378 bits are input to a second adder 306. The remaining 78 Class 2 bits are input to adder 306, and a total of 456 bits are output from adder 306. Since the encoding is done on a frame by frame basis, the 456 bits are output each 20 ms, which gives a data rate of 22.8 kbit/s.

Error protection encoding is desirable in communication systems, particularly wireless systems, to inhibit the effects of transmission errors. Error correction encoding enables some transmission errors to be corrected in a receiver, whilst using the error detection code enables any remaining uncorrected errors to be detected. However, not all speech parameter bits undergo error detection encoding since otherwise too many bad frames would occur, and speech information would be lost, and bad frame substitution could occur too often. Too many frame substitutions can produce worse degradation in speech quality than using frames with only slight errors in them. Thus, the error detection code should not be too sensitive. This can be avoided by the error detection being focused only on the most important bits as described above.

Figure 4:
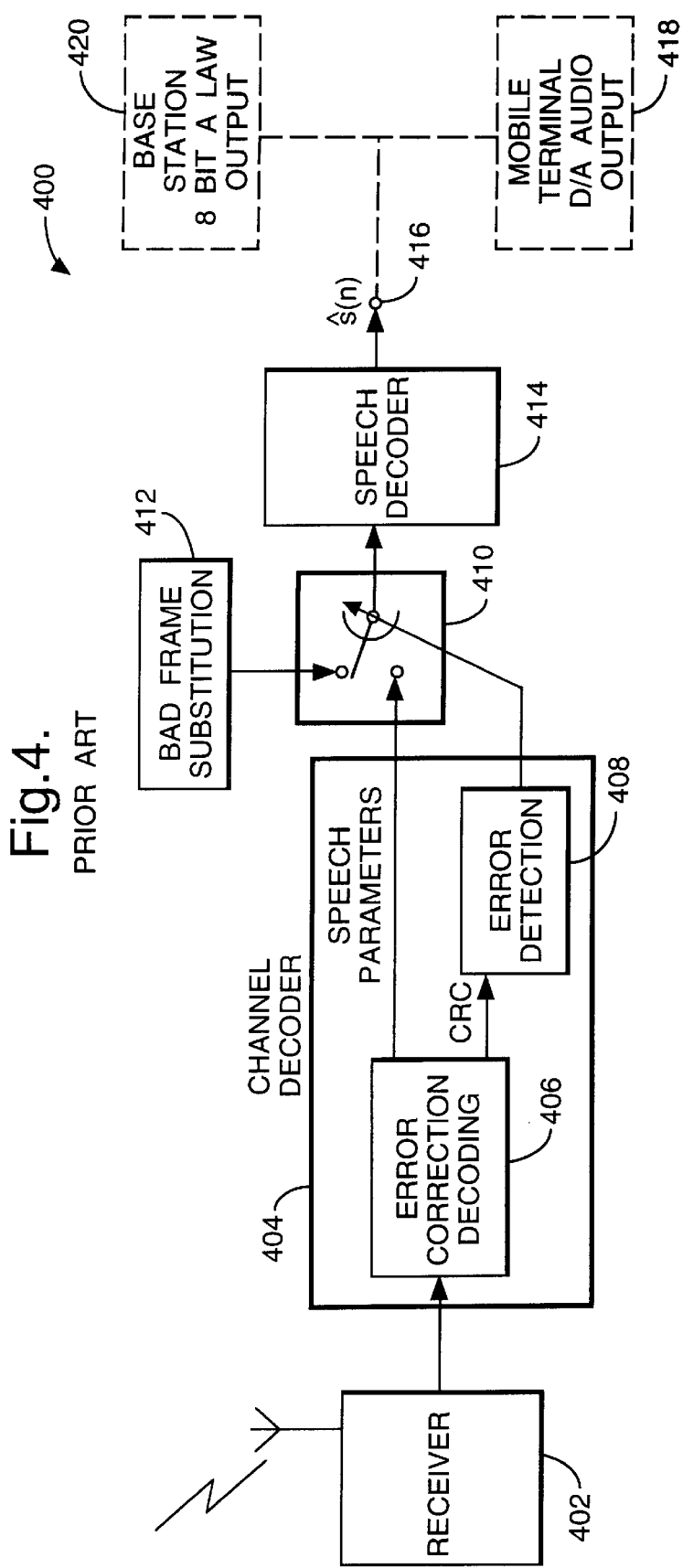
FIG. 4 shows a block diagram of a known speech and channel decoder.

Referring now to FIG. 4, there is shown a block diagram of the speech decoding and channel decoding functions in the receiver of a prior-art digital speech communication system. A signal coded in accordance with the foregoing description is received over the transmission channel via receiver 402, and is first processed in a channel decoder 404 where error correction decoder 406 tries to recover the actual speech parameter bits as well as it can. Error correction decoder 406 outputs the error corrected speech parameter bits and also the error detection CRC bits. Based on these CRC bits, the channel decoder 404 checks in error detection block 408 whether any errors have remained in the most important bits that are covered by the CRC. If no errors are found among these bits, the speech parameters are used in the speech decoder 414 to synthesize the speech to get speech signal 416. However, if errors are detected among the bits covered by the CRC, the received speech parameter frame is declared to be a bad frame and is not used for speech synthesis. Instead, set of speech parameters extrapolated from previous good frames are used. The extrapolation is carried out in the bad frame handler 412. Error detection over the most important bits controls the operation of switch 410 and determines whether the received parameters for each frame are to be used (good frames) or whether the speech parameters have to be produced by extrapolation from previous parameters (i.e., for bade frames). The good or extrapolated frames then got to speech decoder 414 to produce speech signal 416. The speech signal 416 is then forwarded to mobile terminal 418 or base station 420 ports as appropriate, depending upon in which type of apparatus the receiver is located.

Bad frame substitution is well known in the art, and is described, including an example in GSM recommendation 06.11 "Substitution and muting of lost frames for full-rate speech traffic channels", January 1991. Consequently, no further description of bad frame substitution techniques will be given.

Figure 5:
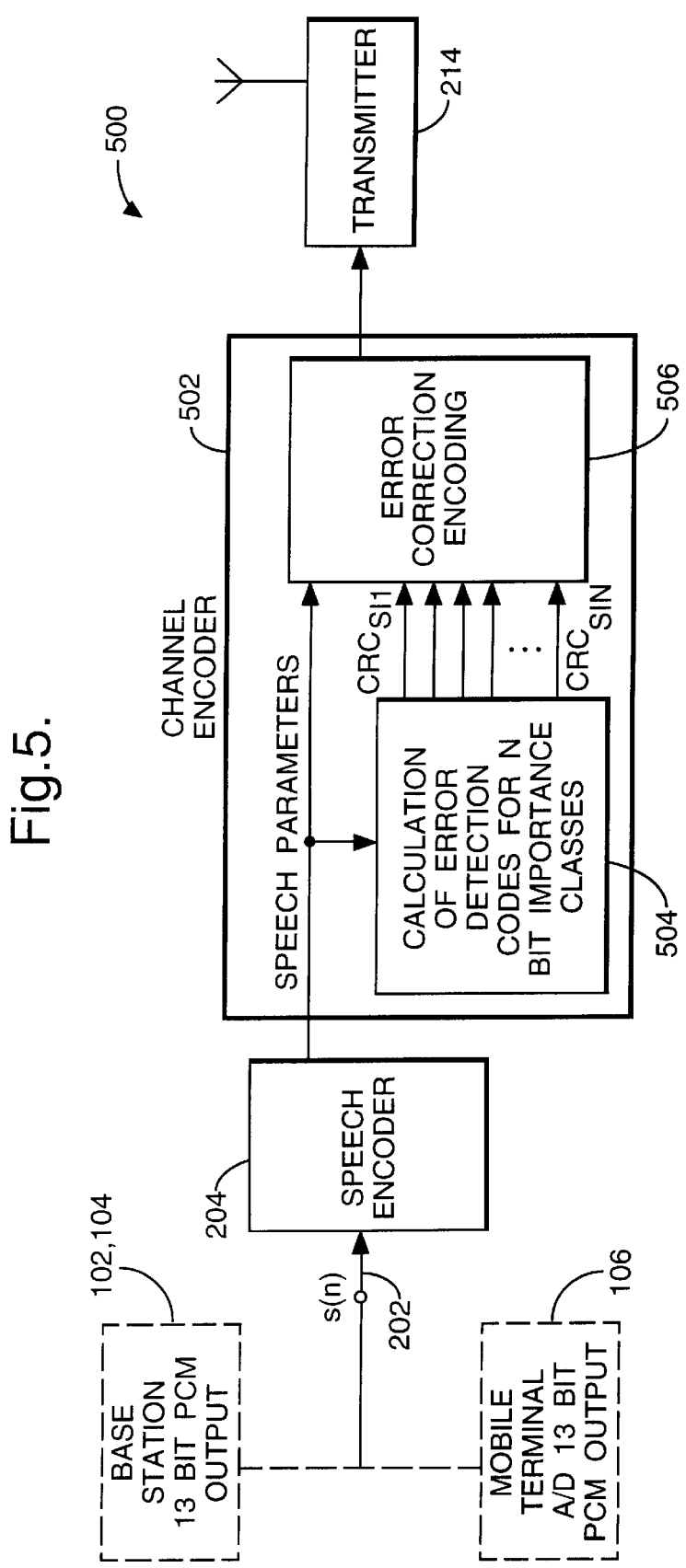
FIG. 5 depicts a block diagram of a speech and channel encoder in accordance with the invention.

Referring now to FIG. 5, there is shown by way of example only, a schematic diagram of a speech encoder and channel encoder for a digital speech communication system transmitter in accordance with an embodiment of the present invention. The speech signal 202 is first encoded in speech encoder 204 and 260 bits/20 ms speech parameter frames are then forwarded into channel encoder 502. The operation of the speech encoder 204 is similar to the operation of speech encoder described with reference to FIG. 2 and hence the same reference numeral is used for the similar part. The channel encoder 502 provides error protection for the speech parameters. The error protection consists of both error detection and error correction encoding carried out in error detection encoder 504 and error correction encoder 506 respectively. In a similar manner to that described with reference to FIG. 3, the speech parameter bits in each frame are order in according with their importance to subjective speech quality. An example of the classification of speech parameter bits is described later with reference to FIG. 6. The speech parameter bits are then grouped together in groups of similar or equal importance. For error detection, several (N) error detection codes are used in such a way that each error detection code focuses on a separate group of bits that have an equal or similar importance to speech quality. These groups are referred to as bit importance classes. The importance of the bits or classes is determined by empirical methods, such as subjective listening tests, during the design of the particular speech algorithm. A parameter, $k_j$, is associated with each bit importance class, and indicates the importance of respective classes to speech quality. Each of these bit importance classes is protected by a separate error detection code. The error detection encoder 504 separates the bits in the speech parameter frame into N bit importance classes and then calculates a separate error detection code for each of the N classes. Any known error detection code, for example a cyclic redundancy check (CRO), may be used. The error detection codes labeled $CRC_{SI1}$, $CRC_{SI2}$ ..., $CRC_{SIN}$ are calculated over all the bits in each bit importance class so that any error in each bit importance class can be detected. This arrangement enables the receiver to detect errors separately in the various importance classes. In addition, a reliable estimation of the quality of the synthesized speech can be made on the basis of such separate error detections. The error detection bits are error correction encoded in error correction encoder 506, together with the speech parameter bits. The total encoded signal is then forwarded to transmitter 214.

Figure 6:
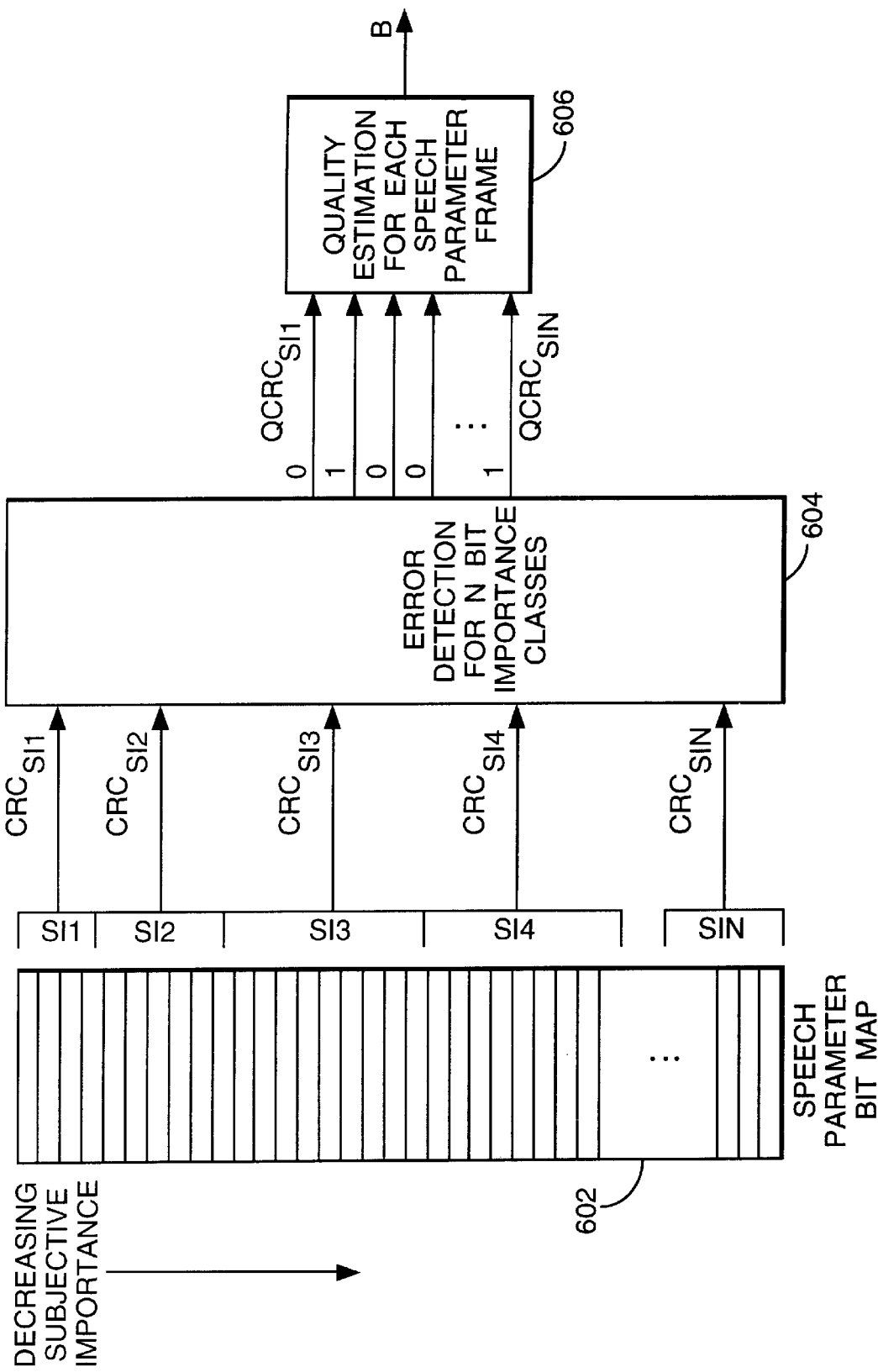
FIG. 6 shows the classification of speech parameters into importance classes, and the respective error detection and quality estimation performed for the classes in accordance with the invention.

Referring now to FIG. 6, there is shown a bit map 602 of the speech parameter bits in the order of decreasing subjective importance and an example of how the speech parameter bits may be grouped into N bits importance classes. The subjective importance class 1 (Sl1) covers the bits that are the most critical to speech quality. The number of bit importance classes is suitably selected according to how severe transmission errors occurring in the system are likely to be. In general, the more bit importance classes that are used, the better the error protection that is achieved. The selection of the bit importance classes may be fixed after determining the likelihood of transmission errors and their severity during the design of the encoder.

Optionally, the grouping and/or number of bit importance classes may be dynamic. Typically, a network monitors the quality of a communication channel between base stations and mobile terminals. If the channel is good then relatively few classes are required, bit if it is poor then more classes would be required. By sending the number of desired classes as side information from the encoder to the decoder the system becomes optimized for the channel conditions, thereby providing dynamic classification of bits into importance classes. If the number of bit importance classes is dynamic, then the parameter $K_i$ could also be transmitted as part of the side information.

Not all speech parameter bits need to be included in a bit importance class. For example, for the well known CELP-type (Code Excited Linear Prediction) speech codecs, the class S11 typically includes the most significant bits of the synthesis filter coefficients and codebook gain coefficients. The class S12 includes the next most significant bits of the synthesis filter coefficients and the codebook gain coefficients, and in addition some of the most significant bits of the codebook indices. Some of the least significant bits of the least importance parameters can be left outside any error detection class. It should be noted that in accordance with this embodiment of the invention the speech parameter bits are divided among the classes on the basis of their importance for speech quality. This results in the bits of each speech parameter being distributed amongst the various bit importance classes.

Figure 7:
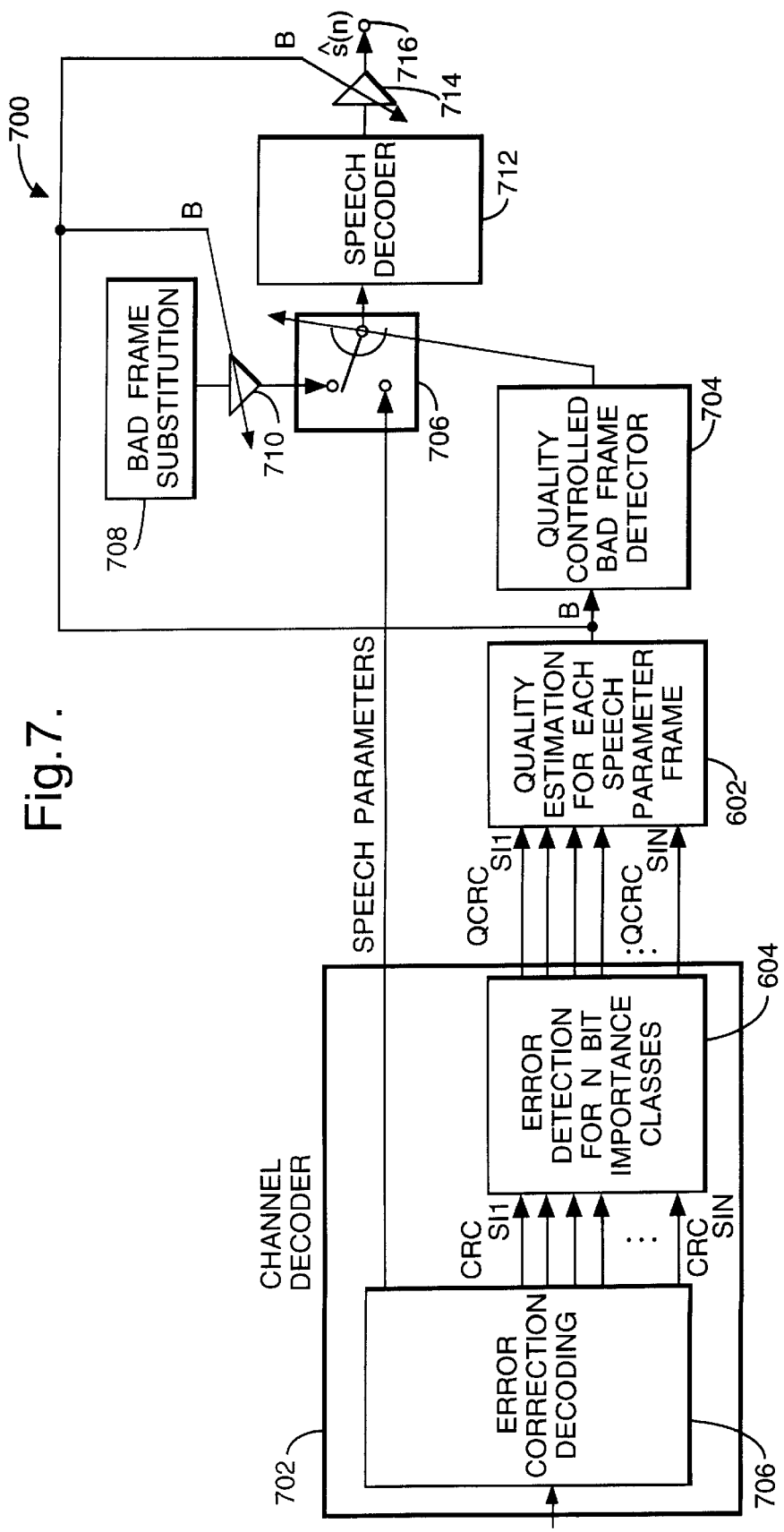
FIG. 7 depicts a block diagram of a speech and channel decoder in accordance with the invention.

FIG. 7 shows a receiver 700 in accordance with a first embodiment of the invention. In general, an overall measure of the level of error in the whole received speech parameter frame is calculated based on both the error detection results for the N separate bit importance classes and the relative importance given by parameter $k_i$, where i=1 . . . , N, of the classes. The relative importance of the classes, indicated by parameter $K_i$, is known in advance by the quality estimator 602, either as fixed data or dynamic data dependent on channel quality for example. The speech parameter frame will be declared bad if the measure of total degradation indicated by variable B for each speech parameter frame shows that the overall quality of the received speech frame is too low for speech synthesis. The total degradation is based on the errors detected for each bit importance class within the speech frame. Using this quality measure a reliable bad frame detection is made because the differences in the importance of bits can be taken advantage of. In accordance with this embodiment of the present invention all the speech parameter bits can be covered by error detection coding without causing an excessive number of bad frames being detected. This is because detection of bad frames is based on the separate detection of errors in several bit importance classes. In the channel decoder 702, for each bit importance class the error detection codes $CRC_{Sl1}$, $CRC_{Sl2}$, . . . $CRC_{SlN}$ are checked to see if they indicate an error. For each bit importance class, a binary indication of error $QCRC_{Sl1}$ $QCRC_{Sl2}$, . . . $QCRC_{SlN}$ is then formed and used to form an overall quality measure B for each speech parameter frame. The binary indication is set to 0 when no error is detected and to 1 when an error is detected. Each error indication $QCRC_{Sli}$ is multiplied by its associated weighting factor, and the sum of the errors multiplied by their respective weighting factors gives the overall quality measure B. The quality measure is then used for bad frame detection. The operation of the receiver is described in more detail below.

A received signal is input to channel decoder 702 from receiver circuitry (not shown), and directed to error correction decoder 706. Error correction decoder 706 typically deconvolves the received signal to remove the error correction information and produce a set of corrected speech parameters and cyclic redundancy checks $CRC_{Sl1}$ . . . $CRC_{SlN}$ corresponding to respective bit importance classes Sl1 . . . SlN as shown on bit map 602. Any such error correction decoding could be used, for example, a Viterbi algorithm. The cyclic redundancy checks $CRC_{Sl1}$ . . . $CRC_{SlN}$ are input to error detection decoder 604 where it is determined if an error has occurred in respective importance classes. Error results $QCRC_{Sl1}$ . . . $QCRC_{SlN}$ are output from respective importance classes.

The value of the weighting factors depend on the relative importance of the classes to each other. The greater the importance of the class of bits, the greater the weighting ($K_l > K_m$ when 1<m, where 1 and m indicate the importance classes Sl1 and Slm for which the weighting is performed). Typical values are the range 0.0 to 1.0, but it should be noted that this range is not exhaustive and other ranges may be suitable. The weighting factor values are suitably chosen to match the transmission conditions for a particular system. The weighting factors may be dynamic and dependent on the quality of transmission channel. For example, depending on the signal to noise ratio for the transmission channel, the weighting factors may be increased or decreased.

The value of B for a frame determines whether that frame is to be considered a good or bad frame for speech synthesis. This has the effect that a single transmission error for higher importance bits or several errors in lower importance bits result in the received speech frame being classified as bad. However, the occurrence of errors in just some of the less important classes result in a B value which is tolerable and the received speech frame is declared good, and is used for speech synthesis. In this manner improved bad frame detection may be achieved.

The classification of frames into good or bad frames is carried out in bad frame detector 704, which receives value B from quality estimation circuitry 602. Bad frame detector 704 controls switch 706 which switches in bad frame substitution circuitry 708 when a bad frame is detected at 704. The value B may also act on gain element 710 which controls the amplitude of the good speech frame substituted for the bad speech frame. The good or substitute speech frame is forwarded via switch 706 to speech decoder 712 where a speech signal is synthesized.

The output of speech decoder 712 may be modified by gain element 714 under the control of signal B. This is particularly applicable for attenuating the output of decoder 712 when the speech frame to be used actually contains a relatively high number of errors. The final speech signal is output at 716 to the base station 102, 104 or mobile terminal 106 port s as appropriate.

A detailed description of a method of evaluating the quality of a received speech frame in accordance with an embodiment of the invention, is now described by way of example only and with reference to FIG. 7.

The error results $QCRC_{Sl1}$ . . . $QCRC_{SlN}$ are forwarded to quality estimation circuitry 602 where an estimate B of the quality of the speech frame is estimated in accordance with the following equation, $$B = k_1 QCRC_{Sl1} + K_2 QCRC_{Sl2} + \ldots + \ldots K_N QCRC_{SlN}$$

where $k_i$ and $QCRC_{Sli}$ are weight factors and error results respectively, and where i=1, . . . , N.

$$QCRC_{Sli} = \begin{cases} 0, & \text{when no error is detected in class i} \\ 1, & \text{when error is detected in class i} \end{cases}$$

The value B is then used by bad frame detector 704 to determine whether a speech frame is good or bad.

A single bit-error detected in an importance class that has a weighting factor of at least 1.0 results in the whole speech parameter frame being classified a bad frame. For the less important classes with weighting factors less than 1.0, a detected error in at least two importance classes is needed to classify the received speech parameter frame to a bad frame. The decision whether the received speech frame is good or bad is made in bad frame detector 704 on basis of the quality measure B according to the following rule:

the frame is defined as good if B<1.0, the frame is defined as bad if B>1.0.

The good frames (B<1.0) are used for speech synthesis whereas the bad frames (B>1.0) are not used for speech synthesis, but are substituted by extrapolating a replacement frame from previous good frames. Any known substitution method may be used.

It should be noted that it is only in the case where B=0.0 that no errors have been detected in the received speech frame. For the range 0.0<B<1.0, the received speech frame is not completely error-free, but only contains slight errors and can still be considered as usable for speech synthesis, and therefore is defined as a good frame. These low error good frames are used as such for speech synthesis. However, for those good frames for which B is close to 1.0, i.e., for frames that have a considerable amount of errors, additional attenuation is applied in the receiver. This is done to hide the errors in the synthesized speech. Such attenuation being carried out gain element 714 under control of signal B, for example.

The invention facilitates not only an accurate decision on whether the received speech frame is good or bad, but it also gives information on how many errors the received speech frames contain. This is used to provide protection not only against severely error corrupted frames (bad frames) but also against errors in modest error corrupted speech frames (low error good frames) that are used for synthesis. The improved performance is obtained by controlling speech decoding 712 and bad frame substitution 708 to match them to the quality of the received speech for each frame. This adapts the operation of the receiver to suit the changing transmission error conditions.

The quality measure B may be used in the speech decoder 712 to hid the effects caused by low error good frames. This is carried out so that the good frames that are classified to be error-free (B=0.0) are used for speech synthesis as they are received, but for good frames that are classified as being modest error frames (0.0<B <1.0) a further processing is carried out. In accordance with the invention, when the modes error good frames are used for synthesizing speech the synthesized speech is slightly attenuated (optionally, the speech parameters affecting the energy of the decoded speech are slightly attenuated). The attenuation is typically applied only for frames in which B is higher than a certain threshold (e.g. 0.4). Then frames with B less than the threshold indicate error-free or nearly error-free frames and are used for speech synthesis without attenuation. In FIG. 7 a separate attenuator block 714 is drawn to better illustrate the attenuation for the synthesized speech. optionally, attenuation can be performed directly for the speech parameters forwarded to speech decoder 712 from switch 706. The attenuation hides to some extent the audible effects caused by the transmission errors and therefore improves the quality of synthesized speech. The attenuation is a function of B and provides more attenuation for high values of B (relatively high error good frames) and only very little or no attenuation for values close to zero (error-free good frames or nearly error-free good frames). As an example, the following attenuation rule may be applied:

| | |
|---|---|
| attenuation = 3.0 dB for 0.75 ≦ B < 1.0 | (relatively high error good frame) |
| attenuation = 1.5 dB for 0.4 ≦ B < 0.75 | (low error good frame) |
| attenuation = 0 dB for B < 0.4 | (error-free or nearly error-free good frame). (4) |

The amount of attenuation is suitably chosen to suit the particular speech coding method and apparatus used and the transmission conditions in the communication system. Generally, the more transmission errors that have been detected, i.e., the closer B is to 1.0, the higher the attenuation which should be chosen.

Table 1 summarizes the operation of the communication system. The selection of the value x above which attenuation is applied depends on the particular speech coding algorithm, on the number of error detection classes and on the transmission conditions in which the system is operated in. A generally good value for x has been found to be about 0.4.

| B | detected errors | good vs. Bad frame classification | action |
|---|---|---|---|
| B = 0.0 | error-free | good frame | used for speech synthesis (unattenuated) |
| 0.0 < B < x | erroneous (nearly error-free) | good frame | used for speech synthesis (unattenuated) |
| x ≦ B.0 | erroneous (low error or high error) | good frame | speech synthesis with attenuation. (Attenuation depends on the value B |
| B ≦ 1.0 | erroneous | bad frame | substituted |

A specific problem occurring in prior-art systems is that a good frame may be used as a basis of extrapolation in bad frame substitution which contains undetected errors since only a few of the speech parameter bits are error detection encoded. The substitution may thus be based on erroneous parameters and the substitution therefore produces distortions in the synthesized speech. This problem is alleviated in accordance with embodiments of the invention. This is achieved by attenuating the speech signal synthesized using substituted speech frames according to how error corrupted the good frames used for the extrapolation are. The attenuation can be applied directly for the speech parameters affecting the energy of the synthesized speech in attenuator 710 or alternatively for the synthesized speech signal in attenuator 714 or both. The more errors contained in good frame/frames that are used for extrapolation, the more attenuation is applied. The attenuation rule given in Equation 4 may is applicable here also. If extrapolation is based on a single speech parameter frame, the amount of attenuation is based on the quality measure B for this frame. When extrapolation is based on several parameter frames, the attenuation is a suitably weighted combination of the quality measures B for these frames.

A person skilled in the relevant art will understand that the foregoing thresholds and criteria are examples and that the invention is not limited to the specific values mentioned above.

Figure 8:
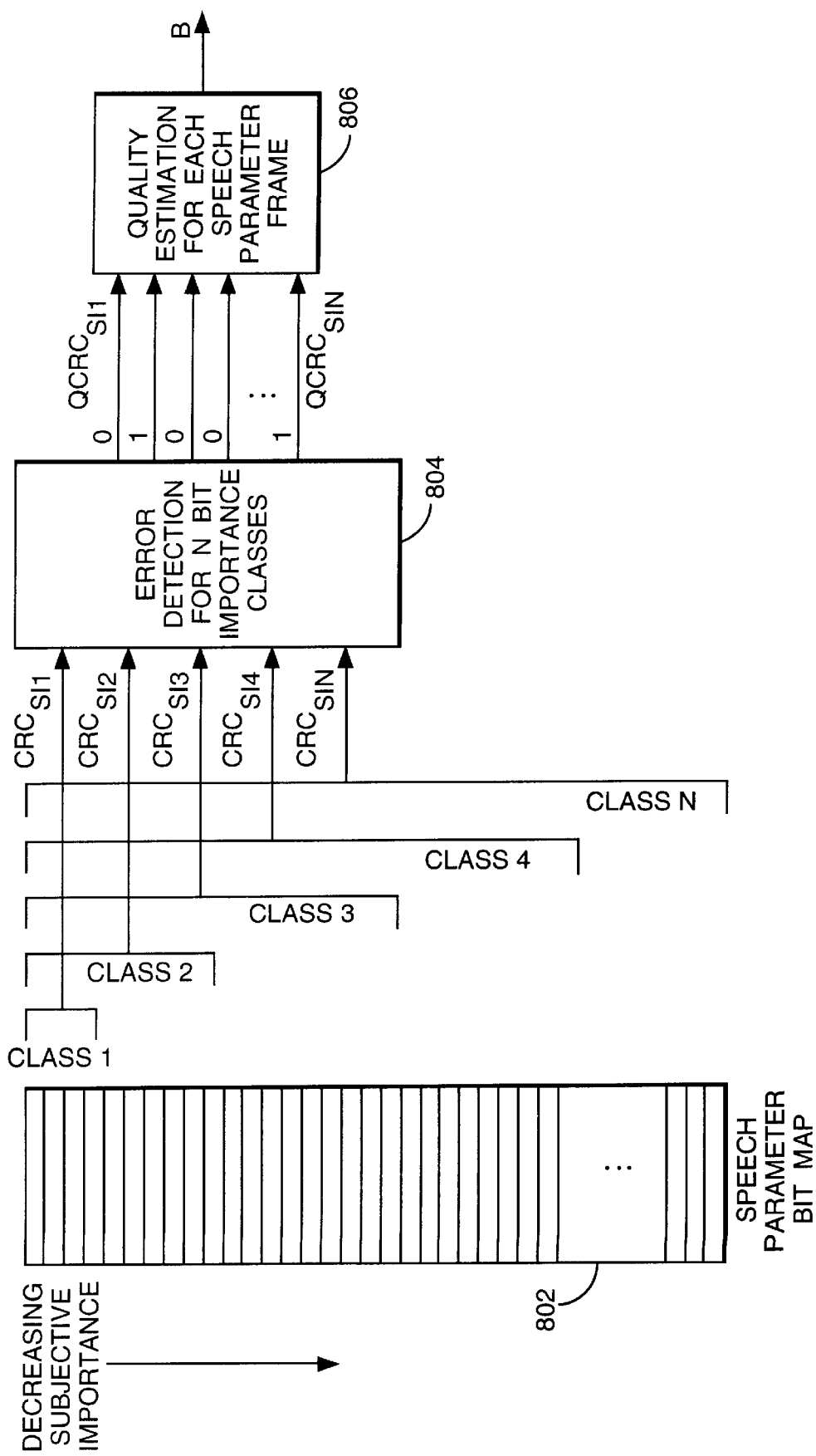
FIG. 8 shows an optional classification of speech parameters into importance classes and the operations performed on them in accordance with the invention.

Referring now to FIG. 8, there is shown a bit map 802 indicating how the speech parameter bits may be grouped into N bit importance classes in accordance with another embodiment of the invention. In this arrangement, the importance classes are organized so that they overlap in such a way that all the bits belonging to a more important class are also included in all the classes with lower importance. That is to say, class 1 bits are contained in class 2, class 1 and class 2 bits are contained in class 3 and so forth. Thus, each of the cyclic redundancy checks $CRC_{SI1}$–$CRC_{SIN}$ correspondingly contain information about the more important classes. This information is processed by error detector 804 and the quality results $QCRC_{SI1}$=$QCRC_{SLN}$ forwarded to quality estimation circuitry 806, where respective weightings $k_i$ are applied to the quality results, and a value B estimated. The value B is then utilized in a similar manner as described with reference to FIG. 7. By using this arrangement, the quality measure B becomes somewhat less accurate than in the first embodiment, because it can detect only what is the most important class in which an error has occurred. However, this arrangement of using overlapping bit importance classes can provide improved reliability for the detection of errors in the most important classes. This is because the bits in the most important classes are covered by not only one but several CRCs. If one CRC check fails and an error remains undetected it will most likely be detected by some of the other CRCs. Thus, although the "undetected" error will only be classified to have occurred in a less important bit importance class than that in which it actually occurred, it will nevertheless result in a high reliability of error detection for the most important bits.

Moreover, modifications to how the bit importance classes overlap may be developed. All such modifications which retain the basic underlying principles disclosed and claimed herein are within the scope of the invention.

Figure 9:
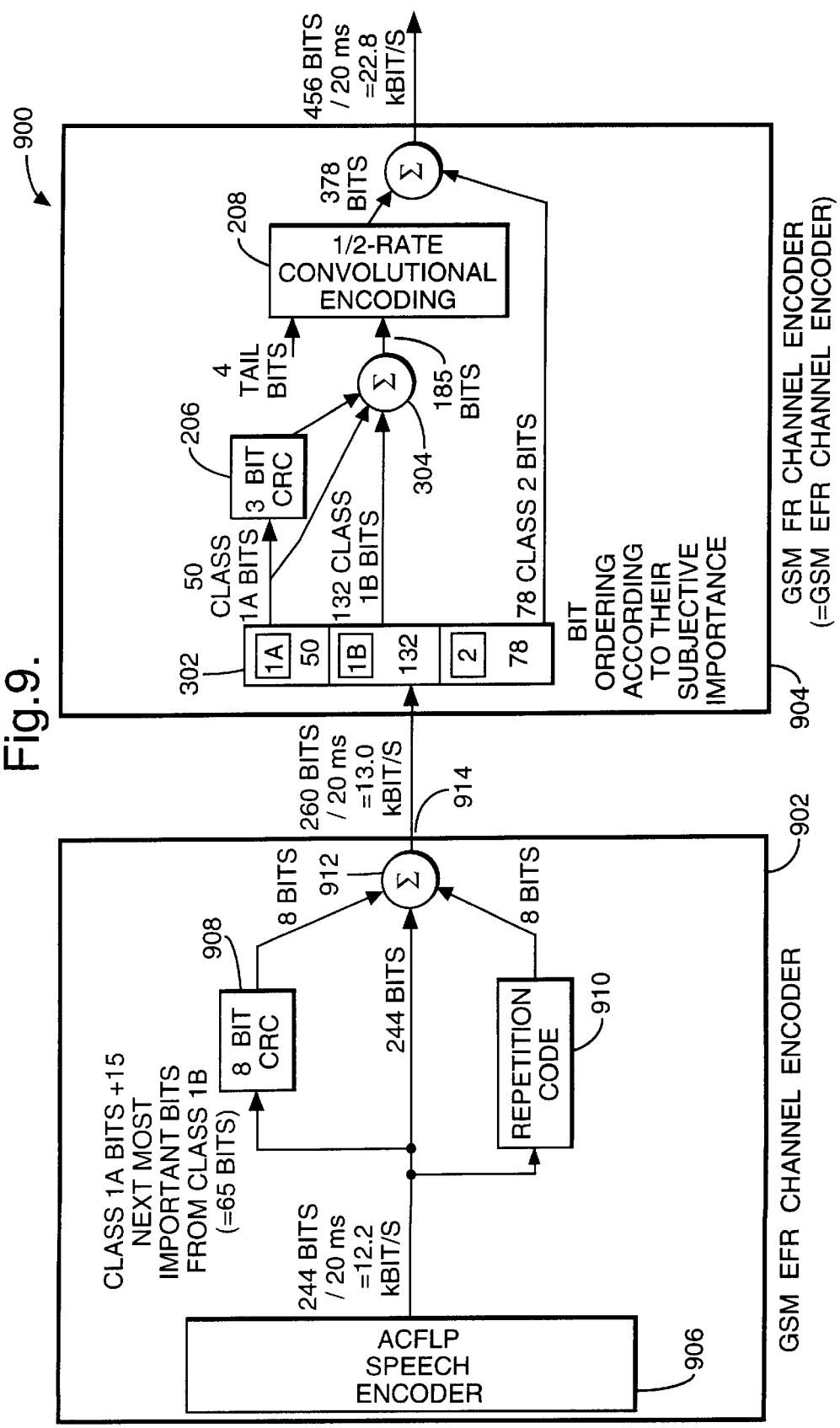
FIG. 9 shows a block diagram of a GSM enhanced full rate encoder operable in accordance with the invention.

An example of a further embodiment in accordance with the present invention is described with reference to FIG. 9. FIG. 9 shows a schematic diagram of a so called GSM enhanced full rate (EFR) encoder 900 comprising speech encoder 902 and channel encoder 904.

GSM EFR encoder 902 comprises an Algebraic Code Excitation Linear Predictive (ACELP) speech encoder 906. Such speech encoders are well known in the art and no further description of its operation will be given since it is not relevant to the instant invention, except to say that 244 bits/20 ms giving a data rate of 12.2 kbit/s is output therefrom.

The most important 65 bits undergo an eight bit cyclic redundancy check in error detection encoder 908. Additionally, a repetition code is generated in repetition coder 910 for some of the 244 bits (4 bits class 2) per 20 ms speech frame. The 8 CRC bits and 8 repetition code bits are added in 912 to the 244 bits to produce a 260 bit/20 ms, 13.0 kbit/s data rate at the output 914 of speech encoder 902. The data rate of 13.0 kbit/s is particularly useful since it facilitates the use of a well known and established prior art channel encoder, the GSM Full Rate (FR) Channel encoder, previously described with reference to FIG. 3. Identical features of FIG. 9 to those in FIG. 3 shall be referred to by the reference numbers of FIG. 3. The 260 bits/20 ms are ordered according to their subjective importance in block 302. The bits are placed in 3 classes. The 50 most important bits are in Class 1A, the 132 next most important bits are in Class 1B and the remaining 78 bits are placed in Class 2. The Class 1A bits are error detection encoded in 206 and the 3 bit CRC code, 50 Class 1A bits and 132 Class 1B bits are added together in adder 304. The resulting 185 bits are error correction encoded in convolutional encoder 208 together with 4 tail bits to produce a 378 bit output. The 78 class 2 bits are added to the 378 bits output from convolutional encoder 208 in adder 306. This gives a 456 bits/20 ms, 22.8 kbit/s data rate output.

Figure 10:
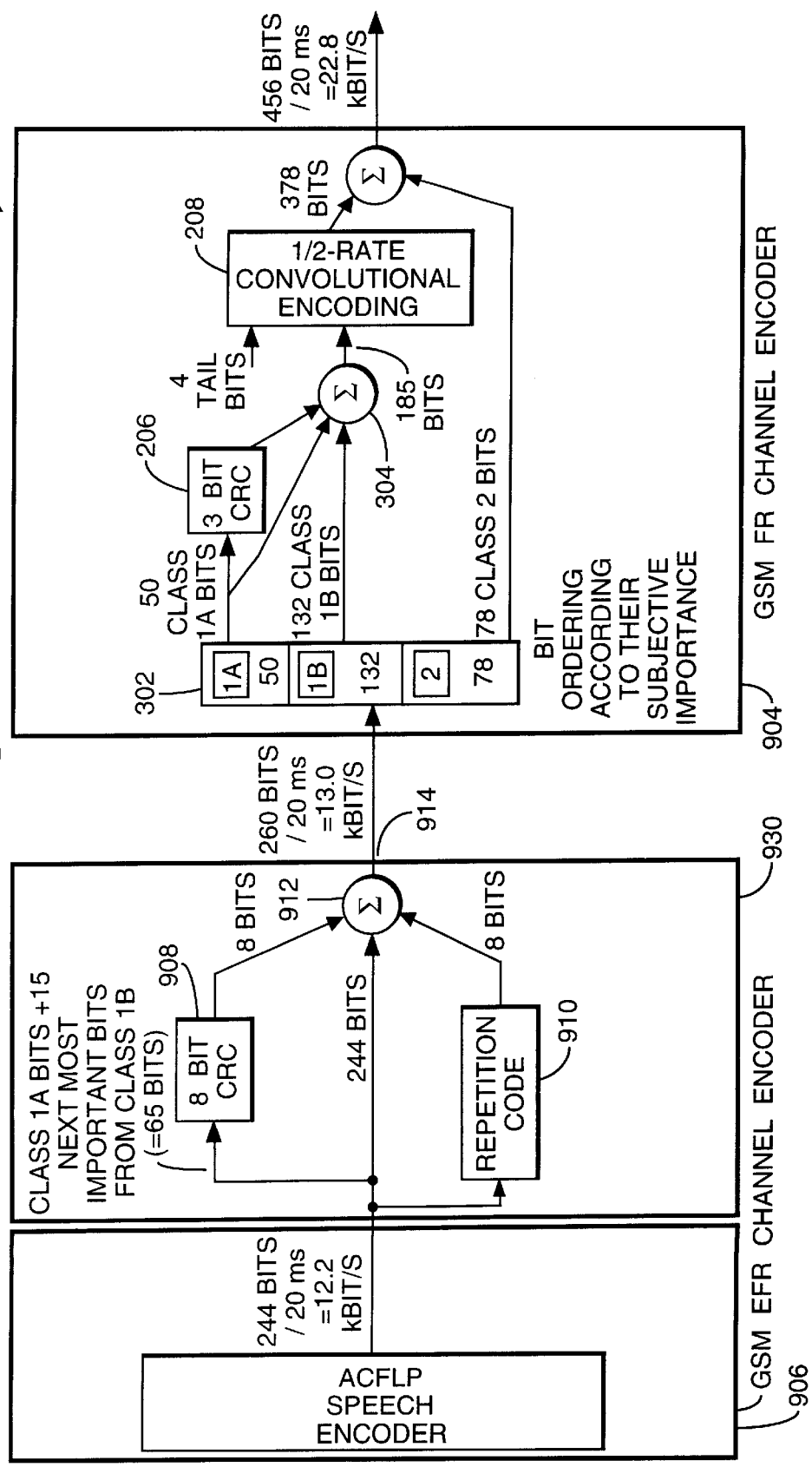
FIG. 10 shows an alternate embodiment of a GSM enhanced full rate encoder operable in accordance with the invention.

An alternative embodiment to that shown in FIG. 9 is shown in FIG. 10. In the embodiment shown in FIG. 10 the 8 bit CRC coder 908 for the class 1A bits and 15 most important bits of class 1B, and the repetition coder 910 are separate from the speech encoder 906. The 8 bit CRC coder 908 and repetition coder 910 now from an additional part for the channel encoder of the EFR coder. The additional coding part is labeled with reference numeral 930 in FIG. 10, and the separate speech coder is labeled 906.

In the foregoing examples relating to FIGS. 9 and 10, the 50 Class 1A bits and the 65 Class 1A and Class 1B bits are encoded in a nested manner in accordance with the general principle described in relation to FIG. 8. That is to say, that the 50 Class 1A bits are encoded by 8 bit encoder 908, and the 50 encoded Class 1A bits and the 15 most important Class 1B bits are encoded by 3 bit encoder 206. The determination of B and subsequent bad frame substitution can then be carried out as described with reference to FIG. 7. The foregoing example is a particularly advantageous embodiment of the invention since it provides improved error detection whilst utilizing a known channel encoder.

Although embodiments of the invention have been described with reference to circuit elements, it will be understood by persons skilled in the relevant art that the invention may be implemented by means of digital signal processor, ASICS or microcontrollers appropriately conditioned to operate in accordance with the methodology described herein.

In view of the foregoing description it will be evident to a person skilled in the art that various modifications may be made within the scope of the invention. For example, the present invention may be utilized in other frame structured speech or formats such as the US PCS 1900 system and structured speech codecs, not just GSM or even TDMA systems. Nor is the invention limited to speech, but may be applied to the transmission of data signals. The invention is also applicable to other forms of communication, not just radio communications.

The scope of the present disclosure includes any novel feature or combination of features disclosed therein either explicitly or implicitly or any generalization thereof irrespective of whether or not it relates to the claimed invention or mitigates any or all of the problems addressed by the present invention. The applicant hereby gives notice that new claims may be formulated to such features during prosecution of this application or of any such further application derived therefrom.

What is claimed is:

1. An encoder for digital communication, comprising:
   means for encoding data into digital signals representative of said data,
   means for classifying the digital signals into first and second classes indicative of their influence on data quality, and
   means for error detection encoding capable of generating at least two error detection codes, wherein the at least two error detection codes respectively correspond to the first and second classes and wherein said first and second classes are overlapping.

2. An encoder according to claim 1, wherein the data is speech and the digital signals are classified according to their importance to speech quality.

3. An encoder according to claim 1 comprising a first coding means generating the first class and a second coding means for generating the second class and sequentially operable to the first coding means.

4. An encoder according to claim 3, wherein the first coding means is a speech encoder and the second coding means is a channel encoder.

5. An encoder according to claim 1 comprising means for receiving frame formatted digital signals.

6. A decoder for digital communication, including:
   means for receiving encoded digital signals classified into first and second digital signal classes corresponding to the importance of said digital signals, wherein said first and second classes are overlapping;
   error detection decoding means for generating error signals corresponding to the respective first and second digital signal classes, and
   means for estimating received digital signal quality responsive to the error signals generated by the error detection decoding means.

7. A decoder according to claim 6, further comprising means for determining the utility of the received digital signals dependent on a result of the quality estimating means.

8. A decoder according to claim 6 wherein said first and second digital signal classes are associated with respective weighting parameters k1, k2 indicative of the importance of said first and second digital signal classes.

9. A decoder according to claim 8, wherein values of respective weighting parameters $k_1, k_2$ are variable in accordance with an error level for the received digital signals.

10. A decoder according to claim 8 wherein the quality estimating means is operable in accordance with the following relationship;

$$B=k_1 QCRC_{SL1}+k_2 QCRC_{SL2}+\ldots+\ldots k_N QCRC_{SLN},$$

where B is the quality estimating means result, $k_i$ is the weighting parameter for the $i^{th}$ digital signal class and $QCRC_{SLi}$ is a binary value for indicating an occurrence of an error in an $i^{th}$ digital signal class, wherein i=1, ... N.

11. A decoder according to claim 10, wherein the digital signals are determined to be usable for B less than a predetermined threshold.

12. A decoder according to claim 6 wherein said digital signals are representative of speech and are classified in accordance with their importance to speech quality.

13. A decoder according to claim 12, wherein the digital signals are formatted into speech frames comprising speech parameters.

14. A decoder according to claim 12, further including a speech decoder for decoding the received digital signals into speech.

15. A decoder according to claim 10, wherein the digital signals are formatted into speech frames comprising speech parameters, and wherein a frame is determined good for B less than the predetermined threshold and bad for B greater than an equal to the predetermined threshold.

16. A decoder according to claim 15, further comprising a speech decoding means and wherein a previous good frame is substitutable for a bad frame, and the previous good frame is transferable to the speech decoding means.

17. A decoder according to claim 15, wherein digital signals in a frame are attenuable in accordance with the result of the quality estimating means associated with said frame.

18. Communication apparatus including;
an encoder for digital speech communication comprising,
means for encoding speech data into digital signals representative of said data,
means for classifying the digital signals into first and second digital signal classes indicative of their influence on data quality, and
means for error detection encoding adapted to generate at least two error detection codes that respectively correspond to the first and second digital signal classes, and wherein said first and second classes are overlapping, and
a decoder for digital speech communication, comprising,
means for receiving encoded digital signals from said encoder,
error detection decoding means for generating error signals from the at least two error detection codes corresponding to respective digital signal classes,
means for estimating the quality of the received digital signals responsive to the error signals generated by the error detection decoding means, and
means for determining the utility of the received digital signals dependent on a result of the quality estimating means.

19. Communication apparatus according to claim 18, comprising a first coding means generating the first class and a second coding means for generating the second class and sequentially operable to the first coding means.

20. Communication apparatus according to claim 18 comprising means for processing frame formatted digital signals.

21. Communication apparatus according to claim 18 including;
means for receiving encoded digital signals classified into first and second digital signal classes corresponding to importance of said digital signals, and
error detection decoding means for generating an error signal corresponding to respective first and second digital signal classes.

22. Communication apparatus according to claim 21, further comprising means for determining the utility of the received digital signals dependent on a result of the quality estimating means.

23. Communication apparatus according to claim 18 wherein said first and second digital signal classes are associated with respective weighting parameters $k_1$, $k_2$ indicative of the importance of said first and second digital signal classes.

24. Communication apparatus according to claim 23, wherein the values of respective weighting parameters $k_1$, $k_2$ are variable in accordance with an error level for the received digital signals.

25. Communication apparatus according to claim 23 wherein the quality estimating means is operable in accordance with the following relationship:

$$B=k_1 QCRC_{SL1}+k_2 QCRC_{SL2}+\ldots+\ldots k_N QCRC_{SLN},$$

where B is the quality estimating means result, $k_1$ is the weighting parameter for the $i^{th}$ digital signal class and $QCRC_{SLi}$ is a binary value for indicating an occurrence of an error in an $i^{th}$ digital signal class, wherein i=1 ... N.

26. Communication apparatus according to claim 25, wherein the digital signals are determined to be usable for B less than a predetermined threshold.

27. Communication apparatus according to claim 18 wherein the digital signals are representative of speech and are classified in accordance with their importance to speech quality.

28. Communication apparatus according to claim 27, wherein the digital signals are formatted into speech frames comprising speech parameters.

29. Communication apparatus according to claim 27 wherein the decoder further comprises a speech decoder for decoding the received digital signals into speech.

30. Communication apparatus according to 25, wherein the digital signals are formatted into speech frames comprising speech parameters and wherein a frame is determined good for B less than predetermined threshold and bad for B greater than an equal to the predetermined threshold.

31. Communication apparatus according to claim 18, wherein the digital signals are formatted into speech frames comprising speech parameters and wherein the decoder is operable such that a previous good frame is substitutable for a bad frame, and the previous good frame is transferable to the speech decoding means.

32. Communication apparatus according to claim 18, wherein the digital signals are formatted into speech frames comprising speech parameters and wherein the decoder is operable to attenuate digital signals for a frame in accordance with the result of the quality estimating means associated with said frame.

33. Communication apparatus according to claim 18 wherein the apparatus further comprises a base-station or a mobile terminal in a digital radio telephone system.

34. A radio telephone network, comprising at least one base-station operable for a respective geographical area, and a plurality of mobile terminals operable for communication with the at least one base-station, wherein the at least one base-station and plurality of mobile terminals respectively include communication apparatus comprising:

an encoder for digital communication comprising,
means for encoding data into digital signals representative of said data,
means for classifying the digital signals into first and second digital signal classes indicative of their influence on data quality, and
means for error detection encoding adapted to generate at least two error detection codes that respectively correspond to the first and second digital signal classes, and wherein said first and second classes are overlapping, and a decoder for digital communication, comprising,
means for receiving encoded digital signals from said encoder,
error detection decoding means for generating error signals from the at least two error detection codes corresponding to respective digital signal classes,
means for estimating the quality of the received digital signals responsive to the error signals generated by the error detection decoding means, and
means for determining the utility of the received digital signals dependent on a result of the quality estimating means.

35. A method for digital communication encoding, comprising encoding data into digital signals representative of said data, classifying the digital signals into first and second classes according to their influence on data quality wherein said first and second classes are overlapping, and generating at least two error detection codes respectively corresponding to the first and second classes.

36. A method according to claim 35, wherein the data is speech and the digital signals are classified according to their importance to speech quality.

37. A method according to claim 35 the first class is generated in a first coding means and the second class is generated in a second coding means sequentially operable to the first coding means.

38. A method according to claim 37, wherein the data is speech and wherein the first coding means is a speech encoder and the second coding means is a channel encoder.

39. A method according to claim 35 wherein said digital signals comprise frame formatted digital signals.

40. A method according to claim 39, wherein the digital signals are representative of speech and are classified in accordance with their importance to speech quality.

41. A method according to claim 40, wherein the digital signals are formatted into speech frames comprising speech parameters.

42. A method according to claim 40, further comprising decoding the received digital signals into speech.

43. A method for digital communication decoding, comprising the steps of:
receiving encoded digital signals classified into first and second digital signal classes corresponding to the importance of said digital signals wherein said first and second classes are overlapping,
decoding the received encoded digital signals for detecting errors corresponding respectively to said first and second digital signal classes, and
estimating the quality for received digital signals based on the result of the decoding of received encoded digital signals.

44. A method according to claim 43, further comprising determining the utility of the received digital signals based on a result of estimating the quality of the received digital signals.

45. A method according to claim 43 further comprising associating respective weighting parameters $k_1$, $k_2$ indicative of digital signal class importance with respective first and second digital signal classes.

46. A method according to claim 45, further comprising varying the value of the respective weighting parameters $k_1$, $k_2$ in accordance with an error level for the received digital signals.

47. A method according to claim 45 operable for estimating the quality of the received digital signals in accordance with the following relationship:

$$B = k_1 QCRC_{SL1} + k_2 QCRC_{SL2} + \ldots + \ldots k_N QCRC_{SLN},$$

where B is the quality estimating means result, $k_i$ is the weighting parameter for the $i^{th}$ digital signal class and $QCRC_{SLi}$ is a binary value for indicating an occurrence of an error in an $i^{th}$ digital signal class, wherein i=1, ... N.

48. A method according to claim 47, further comprising determining digital signals usable for B<1.0.

49. A method according to claim 48 wherein the digital signals are formatted into speech frames comprising speech parameters, and determining a frame good for B<1.0.

50. A method according to claim 49, further comprising substituting a previous good frame for a bad frame and decoding the previous good frame into speech.

51. A method according to claim 49, further comprising attenuating digital signals in a frame in accordance with a result of estimating the quality of the received digital signals associated with said frame.

* * * * *